(12) United States Patent
Kalutarage et al.

(10) Patent No.: US 12,300,491 B2
(45) Date of Patent: May 13, 2025

(54) DEPOSITION OF SEMICONDUCTOR INTEGRATION FILMS

(71) Applicant: Applied Materials, Inc., Santa Clara, CA (US)

(72) Inventors: Lakmal Charidu Kalutarage, San Jose, CA (US); Mark Joseph Saly, Milpitas, CA (US); Bhaskar Jyoti Bhuyan, Milpitas, CA (US); Thomas Joseph Knisley, Livonia, MI (US); Kelvin Chan, San Ramon, CA (US); Regina Germanie Freed, Los Altos, CA (US); David Michael Thompson, San Jose, CA (US); Susmit Singha Roy, Sunnyvale, CA (US); Madhur Sachan, Belmont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/082,872

(22) Filed: Dec. 16, 2022

(65) Prior Publication Data

US 2023/0127535 A1 Apr. 27, 2023
US 2023/0386839 A2 Nov. 30, 2023

Related U.S. Application Data

(62) Division of application No. 16/934,730, filed on Jul. 21, 2020, now Pat. No. 11,562,904.

(51) Int. Cl.
*H01L 21/033* (2006.01)
*H01L 21/02* (2006.01)

(52) U.S. Cl.
CPC .... *H01L 21/0332* (2013.01); *H01L 21/02172* (2013.01); *H01L 21/02205* (2013.01);
(Continued)

(58) Field of Classification Search
CPC .......... H01L 21/0332; H01L 21/02172; H01L 21/02205; H01L 21/02271;
(Continued)

(56) References Cited

U.S. PATENT DOCUMENTS 10,831,096 B2 11/2020 Marks et al.
2010/0099267 A1 4/2010 Wang et al.
(Continued)

FOREIGN PATENT DOCUMENTS

CN 104471689 A 3/2015
JP 2015008283 A 1/2015
(Continued)

OTHER PUBLICATIONS

Non-Final Office Action from U.S. Appl. No. 17/356,304 dated May 10, 2023, 23 pgs.
(Continued)

*Primary Examiner* — Julia Slutsker
(74) *Attorney, Agent, or Firm* — Schwabe, Williamson & Wyatt, P.C.

(57) ABSTRACT

Embodiments disclosed herein include methods of depositing a metal oxo photoresist using dry deposition processes. In an embodiment, the method comprises forming a first metal oxo film on the substrate with a first vapor phase process including a first metal precursor vapor and a first oxidant vapor, and forming a second metal oxo film over the first metal oxo film with a second vapor phase process including a second metal precursor vapor and a second oxidant vapor.

8 Claims, 6 Drawing Sheets

(52) U.S. Cl.
CPC .. *H01L 21/02271* (2013.01); *H01L 21/02274* (2013.01); *H01L 21/0228* (2013.01); *H01L 21/0234* (2013.01)

(58) Field of Classification Search
CPC ........... H01L 21/02274; H01L 21/0228; H01L 21/0234; H01L 21/0271; H01L 21/0273; G03F 7/165; G03F 7/095; G03F 7/0042; C23C 16/40; C23C 16/455; C23C 16/45527; C23C 16/45536; C23C 16/50; B05D 1/60
See application file for complete search history.

(56) References Cited

U.S. PATENT DOCUMENTS

| | | | |
|---|---|---|---|
| 2012/0031340 | A1 | 2/2012 | Aggarwal et al. |
| 2015/0004806 | A1 | 1/2015 | Ndiege et al. |
| 2016/0002786 | A1 | 1/2016 | Gatineau et al. |
| 2016/0099147 | A1 | 4/2016 | Kulshreshtha et al. |
| 2020/0115309 | A1* | 4/2020 | Iacono ................. B01J 27/1806 |
| 2020/0176246 | A1 | 6/2020 | Huotari et al. |
| 2020/0219765 | A1 | 7/2020 | Chen et al. |
| 2022/0028684 | A1* | 1/2022 | Chen ......................... G03F 7/11 |
| 2022/0100088 | A1 | 3/2022 | Kuo et al. |
| 2022/0365434 | A1 | 11/2022 | Nardi et al. |

FOREIGN PATENT DOCUMENTS

| | | | |
|---|---|---|---|
| JP | 2017116923 | A | 6/2017 |
| JP | 2019500490 | A | 1/2019 |
| JP | 2019525240 | A | 9/2019 |
| TW | 201614098 | A | 4/2016 |
| TW | 202022493 | A | 6/2020 |
| WO | 2019217749 | A1 | 11/2019 |
| WO | WO 2020-264158 | | 12/2020 |
| WO | WO 2020-264557 | | 12/2020 |
| WO | WO 2021-072042 | | 4/2021 |
| WO | WO 2021-146138 | | 7/2021 |
| WO | WO 2021-202146 | | 10/2021 |

OTHER PUBLICATIONS

Non-Final Office Action from U.S. Appl. No. 16/934,730 dated Mar. 16, 2022, 9 pgs.
Final Office Action from U.S. Appl. No. 16/934,730 dated Jul. 6, 2022, 9 pgs.
First Office Action for Chinese Patent Application No. 202110824339.3, dated Jan. 2, 2025, 9 pages.
Notice of First Office Action from Chinese Patent Application No. 202110824340.6 dated Jan. 2, 2025, 17 pgs.
Notice of Reasons for Rejection for Japanese Patent Application No. 2021-115403, dated Feb. 4, 2025, 5 pages.
Notice of Reasons for Rejection from Japanese Patent Application No. 2021-117634, dated Feb. 12, 2025, 4 pgs.
Official Letter from the Taiwan Intellectual Property Office for Taiwan Patent Application No. 110126763 dated Feb. 26, 2025, 8 pgs.
Official Letter from the Taiwan Intellectual Property Office for Taiwan Patent Application No. 110126767 dated Feb. 27, 2025, 10 pgs.

* cited by examiner

DEPOSITION OF SEMICONDUCTOR INTEGRATION FILMS

CROSS-REFERENCE TO RELATED APPLICATIONS

This application is a Divisional of U.S. patent application Ser. No. 16/934,730, filed on Jul. 21, 2020, the entire contents of which are hereby incorporated by reference herein.

BACKGROUND

1) Field

Embodiments of the present disclosure pertain to the field of semiconductor processing and, in particular, to methods of depositing a photoresist layer onto a substrate using vapor phase processes.

2) Description of Related Art

Lithography has been used in the semiconductor industry for decades for creating 2D and 3D patterns in microelectronic devices. The lithography process involves spin-on deposition of a film (photoresist), irradiation of the film with a selected pattern by an energy source (exposure), and removal (etch) of exposed (positive tone) or non-exposed (negative tone) region of the film by dissolving in a solvent. A bake will be carried out to drive off remaining solvent.

The photoresist should be a radiation sensitive material and upon irradiation a chemical transformation occurs in the exposed part of the film which enables a change in solubility between exposed and non-exposed regions. Using this solubility change, either exposed or non-exposed regions of the photoresist is removed (etched). Now the photoresist is developed and the pattern can be transferred to the underlying thin film or substrate by etching. After the pattern is transferred, the residual photoresist is removed and repeating this process many times can give 2D and 3D structures to be used in microelectronic devices.

Several properties are important in lithography processes. Such important properties include sensitivity, resolution, lower line-edge roughness (LER), etch resistance, and ability to form thinner layers. When the sensitivity is higher, the energy required to change the solubility of the as-deposited film is lower. This enables higher efficiency in the lithographic process. Resolution and LER determine how narrow features can be achieved by the lithographic process. Higher etch resistant materials are required for pattern transferring to form deep structures. Higher etch resistant materials also enable thinner films. Thinner films increase the efficiency of the lithographic process.

SUMMARY

Embodiments disclosed herein include methods of forming metal oxo photoresists with vapor phase processes. In an embodiment, a method of forming a photoresist layer over a substrate comprises forming a first metal oxo film on the substrate with a first vapor phase process including a first metal precursor vapor and a first oxidant vapor, and forming a second metal oxo film over the first metal oxo film with a second vapor phase process including a second metal precursor vapor and a second oxidant vapor.

In an additional embodiment, a method of forming a photoresist layer over a substrate in a vacuum chamber comprises providing a metal precursor vapor into the vacuum chamber, where the metal precursor has a generic formula $MR_xL_y$, where M is a metal, R is a leaving group, L is a ligand, x is between 0 and 6, and y is between 0 and 6. The method may further comprise providing an oxidant vapor into the vacuum chamber, where a reaction between the metal precursor vapor and the oxidant vapor results in the formation of the photoresist layer on a surface of the substrate, and where the photoresist layer is a metal oxo containing material.

In an additional embodiment, a method of forming a photoresist layer over a substrate in a vacuum chamber comprises initiating a deposition cycle. In an embodiment, the deposition cycle comprises providing a metal precursor vapor into the vacuum chamber, where the metal precursor has a generic formula $MR_xL_y$, where M is a metal, R is a leaving group, L is a ligand, x is between 0 and 6, and y is between 0 and 6. In an embodiment, the metal precursor vapor absorbs to a surface over the substrate. The deposition cycle may further comprise purging the vacuum chamber, and providing an oxidant vapor into the vacuum chamber, where a reaction between the metal precursor absorbed to the surface over the substrate and the oxidant vapor results in the formation of the photoresist layer over the surface of the substrate. In an embodiment, the photoresist layer is a metal oxo containing material. In an embodiment, the deposition cycle may further comprise purging the vacuum chamber.

DETAILED DESCRIPTION

Figure 1:
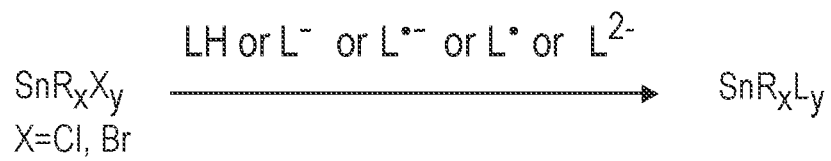
FIG. 1 is a chemical equation of the synthesis of a metal precursor used in a vapor deposition process to form a metal oxo film, in accordance with an embodiment of the present disclosure.

Methods of depositing a photoresist on a substrate using vapor phase processes are described herein. In the following description, numerous specific details are set forth, such as chemical vapor deposition (CVD) and atomic layer deposition (ALD) processes and material regimes for depositing a photoresist, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

To provide context, photoresist systems used in extreme ultraviolet (EUV) lithography suffer from low efficiency. That is, existing photoresist material systems for EUV lithography require high dosages in order to provide the needed solubility switch that allows for developing the photoresist material. Organic-inorganic hybrid materials (e.g., metal oxo materials systems) have been proposed as a material system for EUV lithography due to the increased sensitivity to EUV radiation. Such material systems typically comprise a metal (e.g., Sn, Hf, Zr, etc.), oxygen, and carbon. The metal oxo molecules may sometimes be referred to as nanoparticles. Metal oxo based organic-inorganic hybrid materials have also been shown to provide lower LER and higher resolution, which are required characteristics for forming narrow features.

Metal oxo material systems are currently disposed over a substrate using a wet process. The metal oxo material system is dissolved in a solvent and distributed over the substrate (e.g., a wafer) using wet chemistry deposition processes, such as a spin coating process. Wet chemistry deposition of the photoresist suffers from several drawbacks. One negative aspect of wet chemistry deposition is that a large amount of wet byproducts are generated. Wet byproducts are not desirable and the semiconductor industry is actively working to reduce wet byproducts wherever possible. Additionally, wet chemistry deposition may result in non-uniformity issues. For example, spin-on deposition may provide a photoresist layer that has a non-uniform thickness or non-uniform distribution of the metal oxo molecules. Additionally, it has been shown that metal oxo photoresist material systems suffer from thickness reduction after exposure, which is troublesome in lithographic processes. Furthermore, in a spin-on process, the percentage of metal in the photoresist is fixed, and cannot be easily tuned.

Accordingly, embodiments of the present disclosure provide a vacuum deposition process for providing a metal oxo photoresist layer. The vacuum deposition process addresses the shortcomings of the wet deposition process described above. Particularly, a vacuum deposition process provides the advantages of: 1) eliminating the generation of wet byproducts; 2) providing a highly uniform photoresist layer; 3) resisting thickness reduction after exposure; 4) providing a mechanism to tune the percentage of metal in the photoresist; and 5) enabling the formation of a photoresist layer with a tailored non-uniform material composition through a thickness of the photoresist layer.

The ability to form a tailored and non-uniform material composition through the thickness of the photoresist layer generates improved properties of the photoresist. For example, a bottom portion of the photoresist layer that interfaces with the underlying substrate may be a material composition that has a higher adhesion strength. Additionally, the bottom portion of the photoresist layer may be engineered to have a lower sensitivity to the radiation. In a negative tone resist, a lower sensitivity may be useful to prevent scumming after development of the photoresist. Scumming may refer to presence of residual photoresist material that is not cleared from the pattern after development. Embodiments may also include a graded material composition through a thickness of the photoresist. Grading the material composition may be used to control the exposure latitude curve of the photoresist. This allows for control of the developed profile of the photoresist and/or can be used to provide optical proximity correction (OPC). OPC is typically implemented by altering the pattern in the mask. However, embodiments disclosed herein allow for OPC techniques to be implemented through changes to the composition of the photoresist. As such, OPC changes may be implemented without the need to change the photolithography mask, and is therefore a more economical solution.

Embodiments disclosed herein provide various vacuum deposition processes that comprise the reaction of a metal precursor with an oxidant. In a first embodiment, the vacuum deposition process may be a chemical vapor deposition (CVD) process. In a second embodiment, the vacuum deposition process may be an atomic layer deposition (ALD) process. The vacuum deposition process may be a thermal process in some embodiments. In other embodiments, the vacuum deposition process may be a plasma enhanced (PE) deposition process (e.g., PE-CVD or PE-ALD).

In an embodiment, the vacuum deposition process relies on chemical reactions between a metal precursor and an oxidant. The metal precursor and the oxidant are vaporized to a vacuum chamber. The metal precursor reacts with the oxidant to form a photoresist layer comprising a metal oxo on the surface of a substrate. In some embodiments, the metal precursor and the oxidant are provided to the vacuum chamber together. In other embodiments, the metal precursor and the oxidant are provided to the vacuum chamber with alternating pulses. In an ALD or PE-ALD process, a purge of the vacuum chamber may be provided between pulses of the metal precursor and the oxidant.

In an embodiment, the metal precursor may have the general formula $MR_xL_y$. M is a metal center, R is a leaving group, and L is a ligand. In an embodiment, x may be between 0 and 6, and y may be between 0 and 6. The metal precursor may be synthesized using any chemical reaction process. For example, a generic reaction is shown in FIG. 1. As shown, a compound $SnR_xX_y$ (with X being Cl or Br) may be reacted with various ligands to form the metal precursor $SnR_xL_y$. It is to be appreciated that the Sn metal center may be replaced with any suitable metal atom. In an embodiment, the L ligand is responsible for reacting with the oxidant to form the metal oxo molecule, and the R leaving group is released during exposure (e.g., EUV exposure) during the patterning process. As such, the sensitivity of the photoresist may be, at least partially, impacted by the choice of leaving group R.

Choice of the metal center M, the leaving group R, and the ligand L drives different material properties of the metal oxo photoresist. For example, changes to M, R, and L may provide different sensitivities to the radiation, different adhesive properties, different structural properties (i.e., to enable high aspect ratio pattern formation), different etch selectivities, among many other properties. As such, the photoresist may be specifically tailored to a desired purpose. Furthermore, the use of vacuum deposition processes allows for changes to one or more of M, R, and L through a thickness of the photoresist to provide non-uniform material properties within the photoresist, as will be described in greater detail below.

In a particular embodiment, M is Sn. However, it is to be appreciated that M may be any suitable metal element, such as, but not limited to Sn, Hf, Zr, Co, Cr, Mn, Fe, Cu, Ni, Mo, W, Ta, Os, Re, Pd, Pt, Ti, V, In, Al, Sb, Bi, Te, As, Ge, Se, Cd, Ag, Pd, Au, Er, Yb, Pr, La, Na, or Mg.

In an embodiment, the ligand L may be many different chemical structures. In one embodiment, the ligand L may be a pseudo halide ligand. Pseudo halides may include, but are not limited to, CN, CNO, SCN, $N_3$, or SeCN.

In an embodiment, one suitable class of ligands L for the metal precursor is monodentate ligands that comprise a N donor atom. The binding mode to the metal center M is illustrated in Molecule I. Such monodentate ligands may include cyclic ligands. Examples of some such ligands L are provided in Molecules II-V

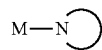  (I)

  (II)

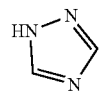  (III)

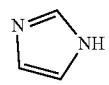  (IV)

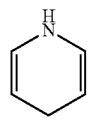  (V)

In an embodiment, the ligand L may also be a bidentate or monodentate ligand comprising N, O, S, or P donor atoms. Binding modes to the metal center for such ligands are illustrated in Molecule VI and Molecule VII. In Molecules VI and VII, X and Y may be N, O, S, or P. Examples of such ligands are illustrated in Molecules VIII-XVIII.

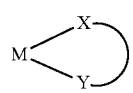  (VI)

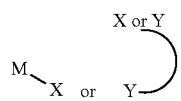  (VII)

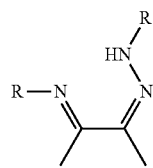  (VIII)

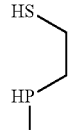  (IX)

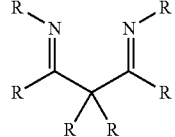  (X)

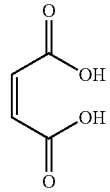  (XI)

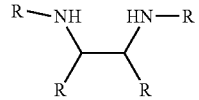  (XII)

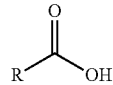  (XIII)

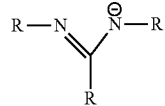  (XIV)

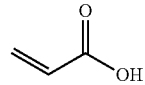  (XV)

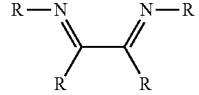  (XVI)

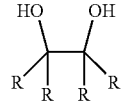  (XVII)

(XVIII)

In an embodiment, the ligand L may also be a bidentate ligand comprising one N donor atom and one O donor atom with the donor atoms bonded to the metal center M. The binding mode to the metal center M for such ligands is illustrated in Molecule XIX. Examples of such ligands are illustrated in Molecules XX-XXIV.

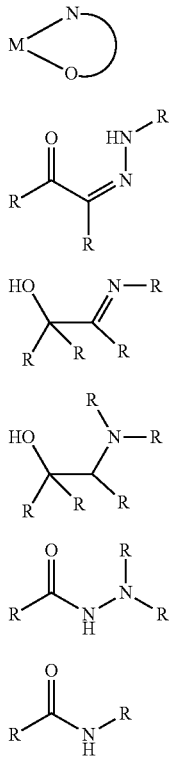

(XIX)

(XX)

(XXI)

(XXII)

(XXIII)

(XXIV)

In an embodiment, the ligand L may also comprise a N donor atom that is donating to more than one metal center. Examples of bonding modes of such ligands are illustrated in Molecules XXV-XXVII.

(XXV)

(XXVI)

(XXVII)

In an embodiment, the ligand L may also comprise a H donor atom. An Examples of such a ligand is illustrated in Molecule XXVIII.

M-H  (XXVIII)

In an embodiment, leaving groups R described herein may include many different suitable molecules. For example, the leaving groups may include one or more of alkyls (C1-C10), alkenyls (internal or terminal), alkynyls (internal or terminal), aryls, or carbenes. The leaving groups R may be linear, branched, or cyclic. In an embodiment, the leaving groups R may also comprise Si, Ge, or Sn as the donor atom.

Examples of suitable alkyls are provided in Molecules XXIX and XXX.

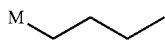

(XXIX)

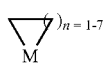

(XXX)

Examples of suitable alkenyls are provided in Molecules XXXI-XXXIII

(XXXI)

(XXXII)

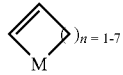

(XXXIII)

An example of a suitable alkynyl is provided in Molecule XXXIV.

(XXXIV)

Examples of suitable aryls are provided in Molecule XXXV and Molecule XXXVI.

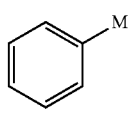

(XXXV)

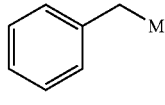

(XXXVI)

Examples of suitable carbenes are provided in Molecule XXXVII and Molecule XXXVIII.

(XXXVII)

(XXXVIII)

Examples of leaving groups R that comprise Si, Ge, or Sn as the donor atom are shown in Molecules XXXIX-XLI, where X is Si, Ge, or Sn.

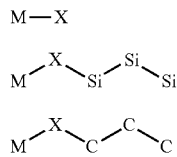

(XXXIX)
(XL)
(XLI)

In an additional embodiment, the metal precursor may also include stannylene precursors. Molecule XLII is an example of a generic stannylene precursor. The ligand L may be any of the ligands L described above or generic amines ($NR_2$). The leaving group R may include any of the leaving groups R described above.

(XLII)

In yet another embodiment, the metal precursor may also be a generic metallic precursor such as the one shown in Molecule XLIII. The R may include any of the leaving groups R described above, and the metal center M may be any metal element such as, but not limited to, Sn, Hf, Zr, Co, Cr, Mn, Fe, Cu, Ni, Mo, W, Ta, Os, Re, Pd, Pt, Ti, V, In, Al, Sb, Bi, Te, As, Ge, Se, Cd, Ag, Pd, Au, Er, Yb, Pr, La, Na, or Mg. Such generic metallic precursors may be used in combination with metal precursors described above.

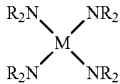

(XLIII)

Figure 2:
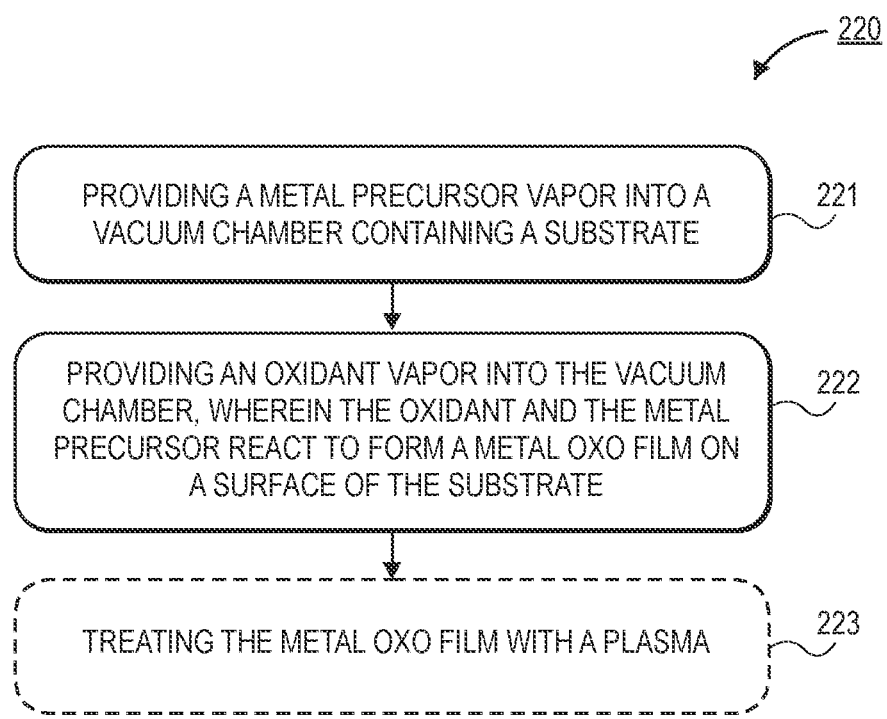
FIG. 2 is a flowchart illustrating a process for forming a photoresist on a substrate using a chemical vapor deposition (CVD) process, in accordance with an embodiment of the present disclosure.

Referring now to FIG. 2, a flowchart illustrating a process 220 for depositing a metal oxo photoresist on a substrate surface is provided, in accordance with an embodiment of the present disclosure. The process 220 may be described as a CVD or a PE-CVD process. In a CVD process, the chemical reactions are driven thermally, whereas in a PE-CVD process the chemical reactions may be enhanced by the presence of a plasma. In PE-CVD processes a hydrocarbon may also be flown into the chamber during plasma assisted deposition to incorporate more carbon into the film. When the plasma is on during the deposition, and if there are hydrocarbon molecules in the chamber, it may add more carbon to the film. A form of carbon could be M-C (M=metal). M-C (e.g., Sn—C) can be sensitive to exposure. A hydrocarbon can be a carbon containing molecule, such as, for example, $CH_2=CH_2$, acetylene, $CH_4$, propylene, etc.

In an embodiment, process 220 may begin with operation 221 which comprises providing a metal precursor vapor into a vacuum chamber containing a substrate. The metal precursor vapor may comprise a metal precursor such as those described in greater detail above. For example, the metal precursor may have the generic formula $MR_xL_y$, where x and y are each between 0 and 6.

In an embodiment, the metal center M may comprise one or more of Sn, Hf, Zr, Co, Cr, Mn, Fe, Cu, Ni, Mo, W, Ta, Os, Re, Pd, Pt, Ti, V, In, Sb, Al, Bi, Te, As, Ge, Se, Cd, Ag, Pb, Au, Er, Yb, Pr, La, Na, and Mg. The leaving group R may comprise one or more of alkyls, alkenyls (internal or terminal), alkynyls (internal or terminal), aryls, or carbenes. The leaving group R may also comprise a Si donor atom, a Ge donor atom, or a Sn donor atom. In an embodiment, the leaving group R may be linear, branched, or cyclic. In an embodiment, the ligands L may comprise pseudo halides, monodentate ligands with N donor atoms, monodentate or bidentate ligands with N, O, S, and/or P donor atoms, bidentate ligands with one N donor atom and one 0 donor atom, a ligand with an N donor atom donating to more than one metal center M, or a hydrogen atom.

In other embodiments, the metal precursor may comprise a stannylene precursor or a generic metallic precursor such as shown in Molecule XLIII. Additionally, it is to be appreciated that more than one metal precursor vapor may be provided into the vacuum chamber. For example, a first metal precursor may comprise Sn and a second metal precursor may comprise Hf. In such embodiments, the resulting metal oxo photoresist may comprise two or more different types of metal atoms. In an embodiment, the metal precursor vapor may be diluted by a carrier gas. The carrier gas may be an inert gas such as, Ar, $N_2$, or He.

In an embodiment, process 220 may continue with operation 222 which comprises providing an oxidant vapor into the vacuum chamber. In an embodiment, the oxidant vapor may comprise a carbon backbone with reactive groups on opposing ends of the carbon backbone. The reactive groups initiate the reaction with the metal precursor that results in the formation of a metal oxo photoresist on the substrate. In an embodiment, the oxidant vapor may comprise water or ethylene glycol. In an embodiment, the oxidant vapor may be diluted by a carrier gas. The carrier gas may be an inert gas such as, Ar, $N_2$, or He.

In an embodiment, process 220 may continue with optional operation 223 which comprises treating the metal oxo photoresist layer with a plasma. In an embodiment, the plasma treatment may include a plasma generated from one or more inert gasses, such as Ar, $N_2$, He, etc. In an embodiment, the inert gas or gasses may also be mixed with one or more oxygen containing gasses, such as $O_2$, $CO_2$, CO, NO, $NO_2$, $H_2O$, etc. In an embodiment, the vacuum chamber may be purged prior to operation 223. The purge may comprise a pulse of an inert gas such as Ar, $N_2$, He, etc.

In one embodiment, process 220 may be executed with operation 221 and 222 being implemented at the same time. That is, providing a metal precursor vapor to the vacuum chamber and providing an oxidant vapor to the vacuum chamber may be done at the same time. After a metal oxo photoresist film with a desired thickness is formed, process 220 may be halted. In an embodiment, the optional plasma treatment operation 223 may be executed after a metal oxo photoresist film with a desired thickness is formed.

In other embodiments, process 220 may be executed in a pulsed manner. That is, a pulse of metal precursor vapor may be provided to the vacuum chamber followed by a pulse of the oxidant vapor. In an embodiment, a cycle comprising a pulse of the metal precursor vapor and a pulse of the oxidant vapor may be repeated a plurality of times to provide a metal oxo photoresist film with a desired thickness. In an embodiment, the order of the cycle may be switched. For example, the oxidant vapor may be pulsed first and the metal precursor vapor may be pulsed second.

In an embodiment, a pulse duration of the metal precursor vapor may be substantially similar to a pulse duration of the oxidant vapor. In other embodiments, the pulse duration of the metal precursor vapor may be different than the pulse duration of the oxidant vapor. In an embodiment, the pulse durations may be between 0 seconds and 1 minute. In a particular embodiment, the pulse durations may be between 1 second and 5 seconds.

In an embodiment, each iteration of the cycle uses the same processing gasses. In other embodiments, the processing gasses may be changed between cycles. For example, a first cycle may utilize a first metal precursor vapor, and a second cycle may utilize a second metal precursor vapor. Subsequent cycles may continue alternating between the first metal precursor vapor and the second metal precursor vapor. In an embodiment, multiple oxidant vapors may be alternated between cycles in a similar fashion.

In an embodiment, the optional plasma treatment of operation 223 may be executed after every cycle. That is, each cycle may comprise a pulse of metal precursor vapor, a pulse of oxidant vapor, and a plasma treatment. In an alternate embodiment, the optional plasma treatment of operation 223 may be executed after a plurality of cycles. In yet another embodiment, the optional plasma treatment operation 223 may be executed after the completion of all cycles (i.e., as a post treatment).

In an embodiment, process 220 may be a thermal process or a plasma process. In the case of a thermal process, the reaction between the metal precursor vapor and the oxidant vapor may be driven thermally. Such an embodiment may be referred to as a CVD process. In the case of a plasma process, a plasma may be struck during one or both of operations 221 and 222. In such instances, the presence of the plasma may enhance the chemical reaction used to form the metal oxo photoresist. Such an embodiment may be referred to as a PE-CVD process. In an embodiment, any plasma source may be used to form the plasma. For example, the plasma source may include, but is not limited to, a capacitively coupled plasma (CCP) source, an inductively coupled plasma (ICP) source, a remote plasma source, or a microwave plasma source.

In an embodiment, the vacuum chamber utilized in process 220 may be any suitable chamber capable of providing a sub-atmospheric pressure. In an embodiment, the vacuum chamber may include temperature control features for controlling chamber wall temperatures and/or for controlling a temperature of the substrate. In an embodiment, the vacuum chamber may also include features for providing a plasma within the chamber. A more detailed description of a suitable vacuum chamber is provided below with respect to FIG. 7.

In an embodiment, the substrate may be temperature controlled during process 220. For example, the temperature of the substrate may be between approximately 0° C. and approximately 500° C. In a particular embodiment, the substrate may be held to a temperature between room temperature and 150° C.

Figure 3:
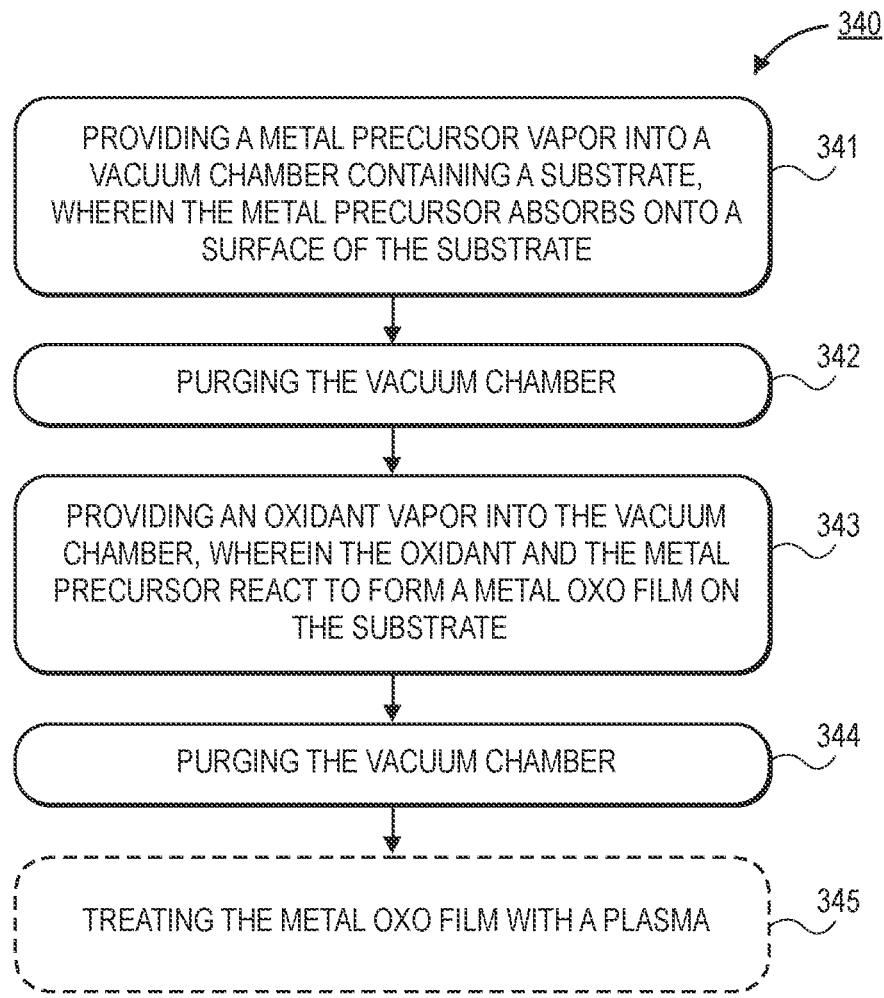
FIG. 3 is a flowchart illustrating a process for forming a photoresist on a substrate using an atomic layer deposition (ALD) process, in accordance with an additional embodiment of the present disclosure.

Referring now to FIG. 3, a flowchart illustrating a process 340 for depositing a metal oxo photoresist on a substrate surface is provided, in accordance with an additional embodiment of the present disclosure. The process 340 may be described as an ALD or a PE-ALD process. In an ALD process, the chemical reactions are driven thermally, whereas in a PE-ALD process the chemical reactions may be enhanced by the presence of a plasma. In PE-ALD processes a hydrocarbon may also be flown into the chamber during plasma assisted deposition to incorporate more carbon into the film. When the plasma is on during the deposition, and if there are hydrocarbon molecules in the chamber, it may add more carbon to the film. A form of carbon could be M-C (M=metal). M-C (e.g., Sn—C) can be sensitive to exposure. A hydrocarbon can be a carbon containing molecule, such as, for example, $CH_2$=$CH_2$, acetylene, $CH_4$, propylene, etc.

In an embodiment, process 340 may begin with operation 341 which comprises providing a metal precursor vapor into a vacuum chamber containing a substrate. In an embodiment, the metal precursor vapor may comprise a molecule with one or more metal atoms. The metal precursor vapor may comprise a metal precursor such as those described in greater detail above. For example, the metal precursor may have the generic formula $MR_xL_y$, where x and y are each between 0 and 6.

In an embodiment, the metal center M may comprise one or more of Sn, Hf, Zr, Co, Cr, Mn, Fe, Cu, Ni, Mo, W, Ta, Os, Re, Pd, Pt, Ti, V, In, Sb, Al, Bi, Te, As, Ge, Se, Cd, Ag, Pb, Au, Er, Yb, Pr, La, Na, and Mg. The leaving group R may comprise one or more of alkyls, alkenyls (internal or terminal), alkynyls (internal or terminal), aryls, or carbenes. The leaving group R may also comprise a Si donor atom, a Ge donor atom, or a Sn donor atom. In an embodiment, the leaving group R may be linear, branched, or cyclic. In an embodiment, the ligands L may comprise pseudo halides, monodentate ligands with N donor atoms, monodentate or bidentate ligands with N, O, S, and/or P donor atoms, bidentate ligands with one N donor atom and one O donor atom, a ligand with an N donor atom donating to more than one metal center M, or a hydrogen atom.

In other embodiments, the metal precursor may comprise a stannylene precursor or a generic metallic precursor such as shown in Molecule XLIII. Additionally, it is to be appreciated that more than one metal precursor vapor may be provided into the vacuum chamber. For example, a first metal precursor may comprise Sn and a second metal precursor may comprise Hf. In such embodiments, the resulting metal oxo photoresist may comprise two or more different types of metal atoms. In an embodiment, the metal precursor vapor may be diluted by a carrier gas. The carrier gas may be an inert gas such as, Ar, $N_2$, or He.

In an embodiment, the metal precursor vapor absorbs to the surface of the substrate. In an embodiment, a monolayer of the metal precursor may be provided substantially over a surface of the substrate. However, in other embodiments several layers of the metal precursor vapor may absorb to the surface of the substrate.

In an embodiment, process 340 may continue with operation 342 which comprises purging the vacuum chamber. In an embodiment, the purging process removes residual metal precursor vapor and any byproducts from the vacuum chamber. The purging process may include a pulse of an inert gas such as, Ar, $N_2$, He, etc.

In an embodiment, process 340 may continue with operation 343 which comprises providing an oxidant vapor into the vacuum chamber. The oxidant vapor reacts with the surface absorbed metal precursor to form a metal oxo photoresist layer over the surface of the substrate. Since the metal precursor is absorbed to the surface of the substrate, the reaction may be considered self-limiting. In an embodiment, the oxidant vapor may comprise a carbon backbone with reactive groups on opposing ends of the carbon backbone. The reactive groups initiate the reaction with the metal precursor that results in the formation of a metal oxo photoresist on the substrate. In an embodiment, the oxidant vapor may comprise water or ethylene glycol. In an embodiment, the oxidant vapor may be diluted by a carrier gas. The carrier gas may be an inert gas such as, Ar, $N_2$, or He.

In an embodiment, a pulse duration of the metal precursor vapor may be substantially similar to a pulse duration of the oxidant vapor. In other embodiments, the pulse duration of the metal precursor vapor may be different than the pulse duration of the oxidant vapor. In an embodiment, the pulse durations may be between 0 seconds and 1 minute. In a particular embodiment, the pulse durations may be between 1 second and 5 seconds.

In an embodiment, process 340 may continue with operation 344 which comprises purging the vacuum chamber. In an embodiment, the purging process removes residual oxidant vapor and any byproducts from the vacuum chamber. The purging process may include a pulse of an inert gas such as, Ar, $N_2$, He, etc.

In an embodiment, process 340 may continue with optional operation 345 which comprises treating the metal oxo photoresist layer with a plasma. In an embodiment, the plasma treatment may include a plasma generated from one or more inert gasses, such as Ar, $N_2$, He, etc. In an embodiment, the inert gas or gasses may also be mixed with one or more oxygen containing gasses, such as $O_2$, $CO_2$, CO, NO, $NO_2$, $H_2O$, etc.

In an embodiment, processing operations 341-344 may define a cycle of the process 340. Embodiments may include repeating the cycle a plurality of times in order to provide a metal oxo photoresist film with a desired thickness. In an embodiment, the optional plasma treatment operation 345 may be executed after each cycle. That is, each cycle may comprise a pulse of metal precursor vapor, a purge, a pulse of oxidant vapor, a purge, and a plasma treatment. In other embodiments, the optional plasma treatment operation 345 may be executed after a plurality of cycles. In an additional embodiment, the optional plasma treatment operation 345 may be executed after the completion of all cycles (i.e., as a post treatment).

In an embodiment, each iteration of the cycle uses the same processing gasses. In other embodiments, the processing gasses may be changed between cycles. For example, a first cycle may utilize a first metal precursor vapor, and a second cycle may utilize a second metal precursor vapor. Subsequent cycles may continue alternating between the first metal precursor vapor and the second metal precursor vapor. In an embodiment, multiple oxidant vapors may be alternated between cycles in a similar fashion.

In an embodiment, process 340 may be a thermal process or a plasma process. In the case of a thermal process, the reaction between the metal precursor vapor and the oxidant vapor may be driven thermally. Such an embodiment may be referred to as an ALD process. In the case of a plasma process, a plasma may be struck during one or both of operations 341 and 343. In such instances, the presence of the plasma may enhance the chemical reaction used to form the metal oxo photoresist. Such an embodiment may be referred to as a PE-ALD process. In an embodiment, any plasma source may be used to form the plasma. For example, the plasma source may include, but is not limited to, a CCP source, an ICP source, a remote plasma source, or a microwave plasma source.

In an embodiment, the vacuum chamber utilized in process 340 may be any suitable chamber capable of providing a sub-atmospheric pressure. In an embodiment, the vacuum chamber may include temperature control features for controlling chamber wall temperatures and/or for controlling a temperature of the substrate. In an embodiment, the vacuum chamber may also include features for providing a plasma within the chamber. A more detailed description of a suitable vacuum chamber is provided below with respect to FIG. 7.

In an embodiment, the substrate may be temperature controlled during process 340. For example, the temperature of the substrate may be between approximately 0° C. and approximately 500° C. In a particular embodiment, the substrate may be held to a temperature between room temperature and 150° C.

Figure 4:
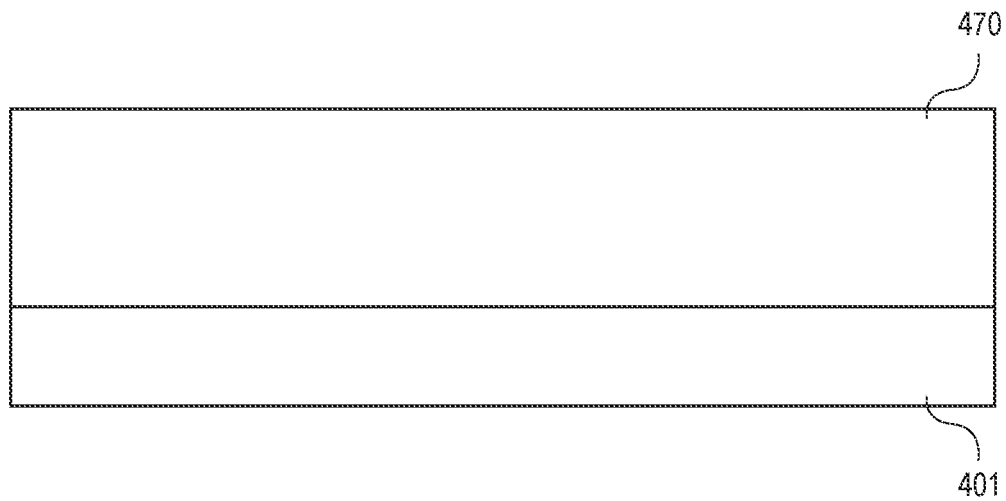
FIG. 4 is a cross-sectional illustration of a metal oxo photoresist over a substrate, in accordance with an embodiment of the present disclosure.

Referring now to FIG. 4, a cross-sectional illustration of a metal oxo photoresist layer 470 over a substrate 401 is shown, in accordance with an embodiment. In an embodiment, the metal oxo photoresist layer 470 may be disposed over the substrate 401 using processes such as process 340 or process 220. The metal oxo photoresist layer 470 may have a substantially uniform composition through a thickness of the metal oxo photoresist layer. However, it is to be appreciated that the metal oxo photoresist may comprise more than one type of metal center M. Such an embodiment may be provided by flowing more than one type of metal precursor into the vacuum chamber at the same time or in alternating pulses.

It is to be appreciated that embodiments are not limited to substantially uniform metal oxo photoresist layers. For example, the composition of the metal oxo photoresist layer may be modulated through a thickness of the metal oxo photoresist layer. For example, the metal center may be changed, the percentage of metal may be changed, or the carbon concentration may be changed, among other variations.

Changes to the composition of the metal oxo photoresist layer in the thickness direction is enabled by the vacuum deposition processes used to form the metal oxo photoresist. For example, the metal precursor vapor or the oxidant vapor may be changed (e.g., different molecules may be used, different flow rates of the vapors may be used, etc.) at different points in the deposition of the metal oxo photoresist. This is a significant improvement over existing wet based spin on processes that are limited to having a substantially uniform material composition through the thickness of the photoresist layer.

As such, embodiments disclosed herein enable enhanced tunability in order to optimize the metal oxo photoresist layer for various applications. For example, the first few nanometers (e.g., the first 10 nm or less) of the metal oxo photoresist layer over the substrate may have a different composition than the rest of the film. This may allow the remainder of the metal oxo photoresist is optimized for dose while the bottom portion is tuned to have improved adhesion, sensitivity to EUV photons, or sensitivity to develop chemistry in order to improve post lithography pattern control (e.g., scumming), as well as defectivity and resist collapse/lift off. In other embodiments, a composition gradient may be provided through the thickness of the metal oxo photoresist. Grading the material composition may be used to control the exposure latitude curve of the photoresist. This allows for control of the developed profile of the photoresist and/or can be used to provide OPC. The gradation may also be optimized for pattern type. For example, pillars may need improved adhesion, whereas line/space patterns may allow for lower adhesion while tuning for improvements in dose.

Figure 5:
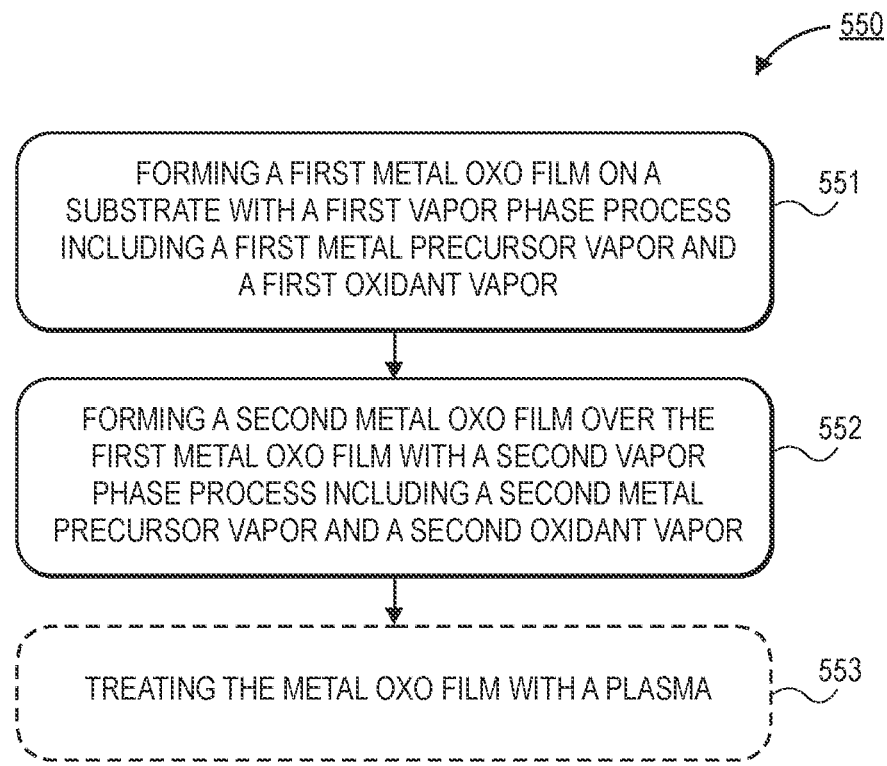
FIG. 5 is a flowchart illustrating a process for forming a photoresist with a non-uniform composition through a thickness of the photoresist, in accordance with an embodiment of the present disclosure.

Referring now to FIG. 5, a flowchart illustrating a process 550 for depositing a metal oxo photoresist on a substrate surface is provided, in accordance with an additional embodiment of the present disclosure. In process 550, the material composition of the metal oxo photoresist is non-uniform through the thickness of the metal oxo photoresist. Process 550 may begin with operation 551, which includes forming a first metal oxo film on a substrate with a first vapor phase process. In an embodiment, the first vapor phase process may include a first metal precursor vapor and a first oxidant vapor. In an embodiment, the first vapor phase process may comprise a CVD or a PE-CVD process similar to the processes 220 described above. In an additional embodiment, the first vapor phase process may comprise an ALD or a PE-ALD process similar to the process 340 described above. The first metal precursor vapor may include any of the metal precursor vapors described in greater detail above.

In an embodiment, process 550 may continue with operation 552, which includes forming a second metal oxo film over the first metal oxo film with a second vapor phase process including a second metal precursor vapor and a second oxidant vapor. In an embodiment, the second vapor phase process may comprise a CVD or a PE-CVD process similar to the processes 220 described above. In an additional embodiment, the second vapor phase process may comprise an ALD or a PE-ALD process similar to the process 340 described above. In an embodiment, the second metal precursor vapor and/or the second oxidant vapor may be different than the first metal precursor vapor and the first oxidant vapor. Accordingly, the second metal oxo film may have a different composition than the first metal oxo film.

Figure 6A:
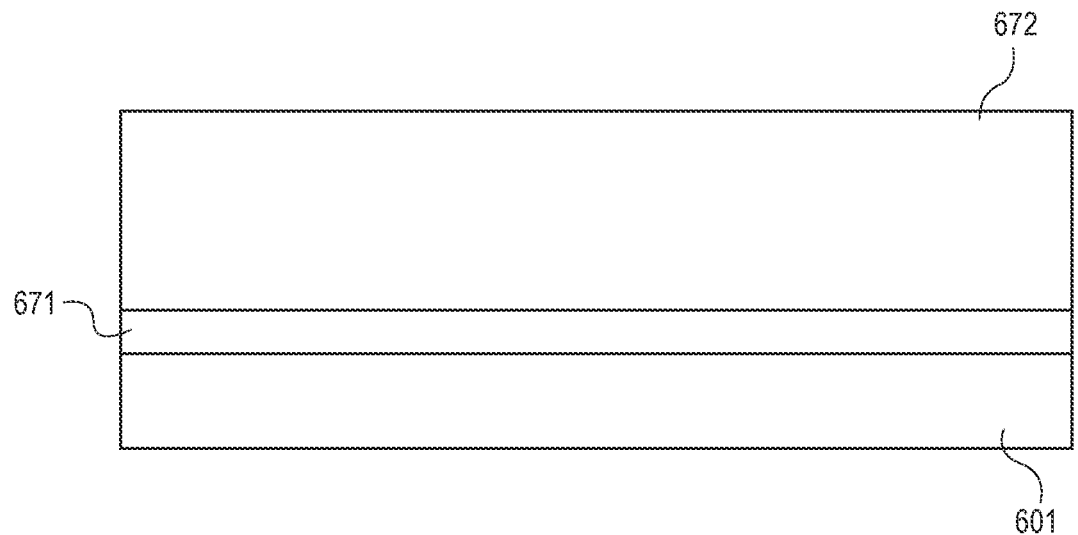
FIG. 6A is a cross-sectional illustration of a metal oxo photoresist over a substrate, where the metal oxo photoresist comprises a first layer and a second layer with different material compositions, in accordance with an embodiment of the present disclosure.

In some embodiments, only two different metal oxo film layers are provided. An example of such an embodiment is shown in FIG. 6A. As shown, a photoresist layer comprising a first metal oxo film 671 and a second metal oxo film 672 is disposed over a substrate 601. In an embodiment, the first metal oxo film 671 is an interface layer that provides an improved adhesion to the substrate 601. The first metal oxo film 671 may have a thickness that is approximately 10 nm or less.

Figure 6B:
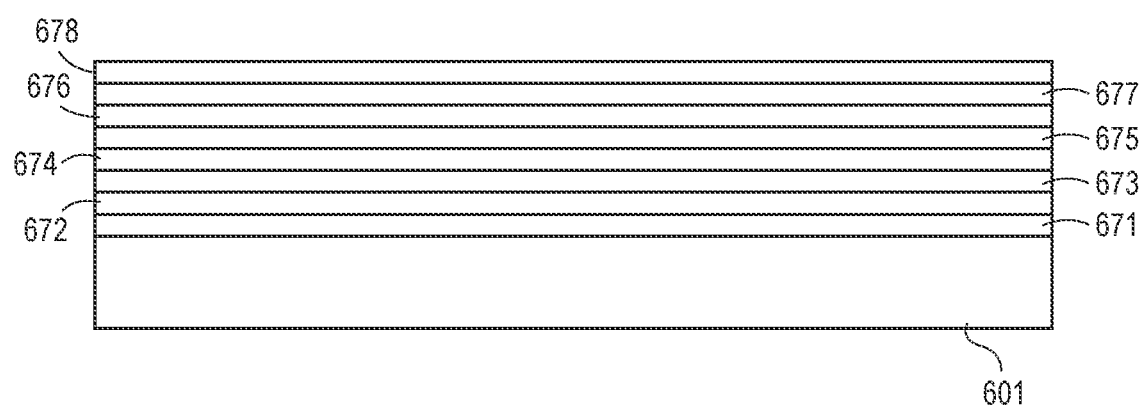
FIG. 6B is a cross-sectional illustration of a metal oxo photoresist over a substrate, where the metal oxo photoresist comprises a plurality of layers that provide a compositional gradient through a thickness of the metal oxo photoresist, in accordance with an embodiment of the present disclosure.

In other embodiments, the photoresist layer may comprise a plurality of different metal oxo film layers. An example, of such an embodiment is shown in FIG. 6B. As shown, the photoresist layer comprises a plurality of different metal oxo film layers 671-678 with different compositions. Such an embodiment may be formed using process 550 with the inclusion of additional vapor phase processes for each layer. In the illustrated embodiment, each of the layers 671-678 are substantially uniform in thickness. However, it is to be appreciated that embodiments may include metal oxo film layers with non-uniform thicknesses.

In an embodiment, process 550 may further comprise an optional plasma treatment of the metal oxo film (or films). In an embodiment, the plasma treatment may be implemented after the deposition of both the first metal oxo film and the second metal oxo film. Alternatively, the plasma treatment may be implemented after the deposition of each metal oxo film. That is, the first metal oxo film may be deposited and followed by a plasma treatment before the deposition of the second metal oxo film. In an embodiment, the plasma treatment may include a plasma generated from one or more inert gasses, such as Ar, $N_2$, He, etc. In an embodiment, the inert gas or gasses may also be mixed with one or more oxygen containing gasses, such as $O_2$, $CO_2$, CO, NO, $NO_2$, $H_2O$, etc.

Providing metal oxo photoresist films using vapor phase processes such as described in the embodiments above provides significant advantages over wet chemistry methods. One such advantage is the elimination of wet byproducts. With a vapor phase process, liquid waste is eliminated and byproduct removal is simplified. Additionally, vapor phase processes provide a more uniform photoresist layer. Uniformity in this sense may refer to thickness uniformity across the wafer and/or uniformity of the distribution of metal components of the metal oxo film. Particularly, CVD, PE-CVD, ALD, and PE-ALD processes have been shown to provide excellent thickness uniformity and constituent uniformity.

Additionally, the use of vapor phase processes provides the ability to fine-tune the percentage of metal in the photoresist and the composition of the metal in the photoresist. The percentage of the metal may be modified by increasing/decreasing the flow rate of the metal precursor into the vacuum chamber and/or by modifying the pulse lengths of the metal precursor/oxidant. The use of a vapor phase process also allows for the inclusion of multiple different metals into the metal oxo film. For example, a single pulse flowing two different metal precursors may be used, or alternating pulses of two different metal precursors may be used. The use of a vapor phase process also allows for the formation of metal oxo films with different material compositions in order to tune the photoresist for a desired application.

Furthermore, it has been shown that metal oxo photoresists that are formed using vapor phase processes are more resistant to thickness reduction after exposure. It is believed, without being tied to a particular mechanism, that the resistance to thickness reduction is attributable, at least in part, to the reduction of carbon loss upon exposure.

Figure 7:
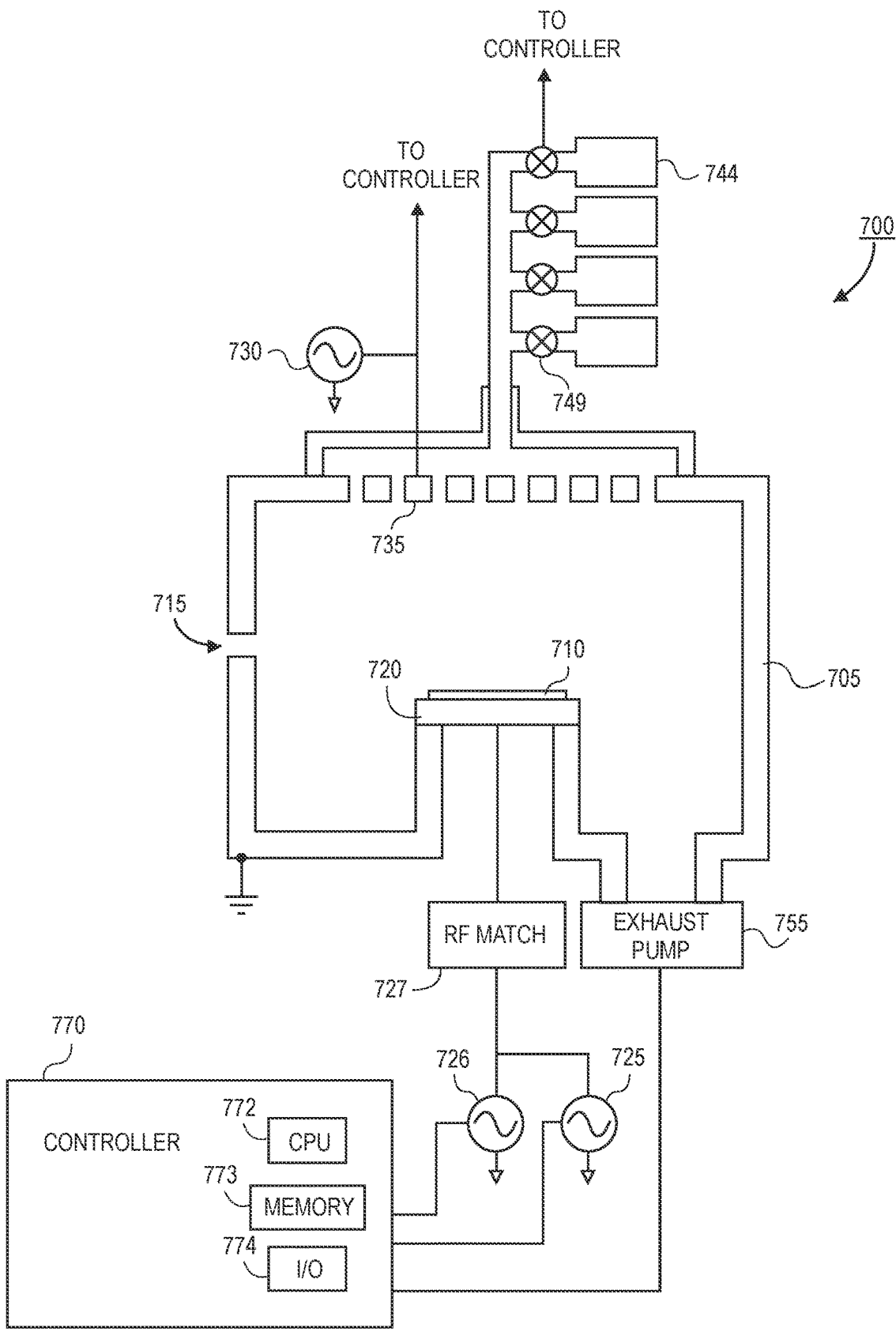
FIG. 7 is a cross-sectional illustration of a processing tool that may be used to implement the process in FIG. 2, FIG. 3, or FIG. 5, in accordance with an embodiment of the present disclosure.

FIG. 7 is a schematic of a vacuum chamber configured to perform a vapor phase deposition of a metal oxo photoresist, in accordance with an embodiment of the present disclosure. Vacuum chamber 700 includes a grounded chamber 705. A substrate 710 is loaded through an opening 715 and clamped to a temperature controlled chuck 720.

Process gases, are supplied from gas sources 744 through respective mass flow controllers 749 to the interior of the chamber 705. In certain embodiments, a gas distribution plate 735 provides for distribution of process gases 744, such as a metal precursor, an oxidant, and an inert gas. Chamber 705 is evacuated via an exhaust pump 755.

When RF power is applied during processing of a substrate 710, a plasma is formed in a chamber processing region over substrate 710. Bias power RF generator 725 is coupled to the temperature controlled chuck 720. Bias power RF generator 725 provides bias power, if desired, to energize the plasma. Bias power RF generator 725 may have a low frequency between about 2 MHz to 60 MHz for example, and in a particular embodiment, is in the 13.56 MHz band. In certain embodiments, the vacuum chamber 700 includes a third bias power RF generator 726 at a frequency at about the 2 MHz band which is connected to the same RF match 727 as bias power RF generator 725. Source power RF generator 730 is coupled through a match (not depicted) to a plasma generating element (e.g., gas distribution plate 735) to provide a source power to energize the plasma. Source RF generator 730 may have a frequency between 100 and 180 MHz, for example, and in a particular embodiment, is in the 162 MHz band. Because substrate diameters have progressed over time, from 150 mm, 200 mm, 300 mm, etc., it is common in the art to normalize the source and bias power of a plasma etch system to the substrate area.

The vacuum chamber 700 is controlled by controller 770. The controller 770 may comprise a CPU 772, a memory 773, and an I/O interface 774. The CPU 772 may execute processing operations within the vacuum chamber 700 in accordance with instructions stored in the memory 773. For example, one or more processes such as processes 220, 340, and 550 described above may be executed in the vacuum chamber by the controller 770.

Figure 8:
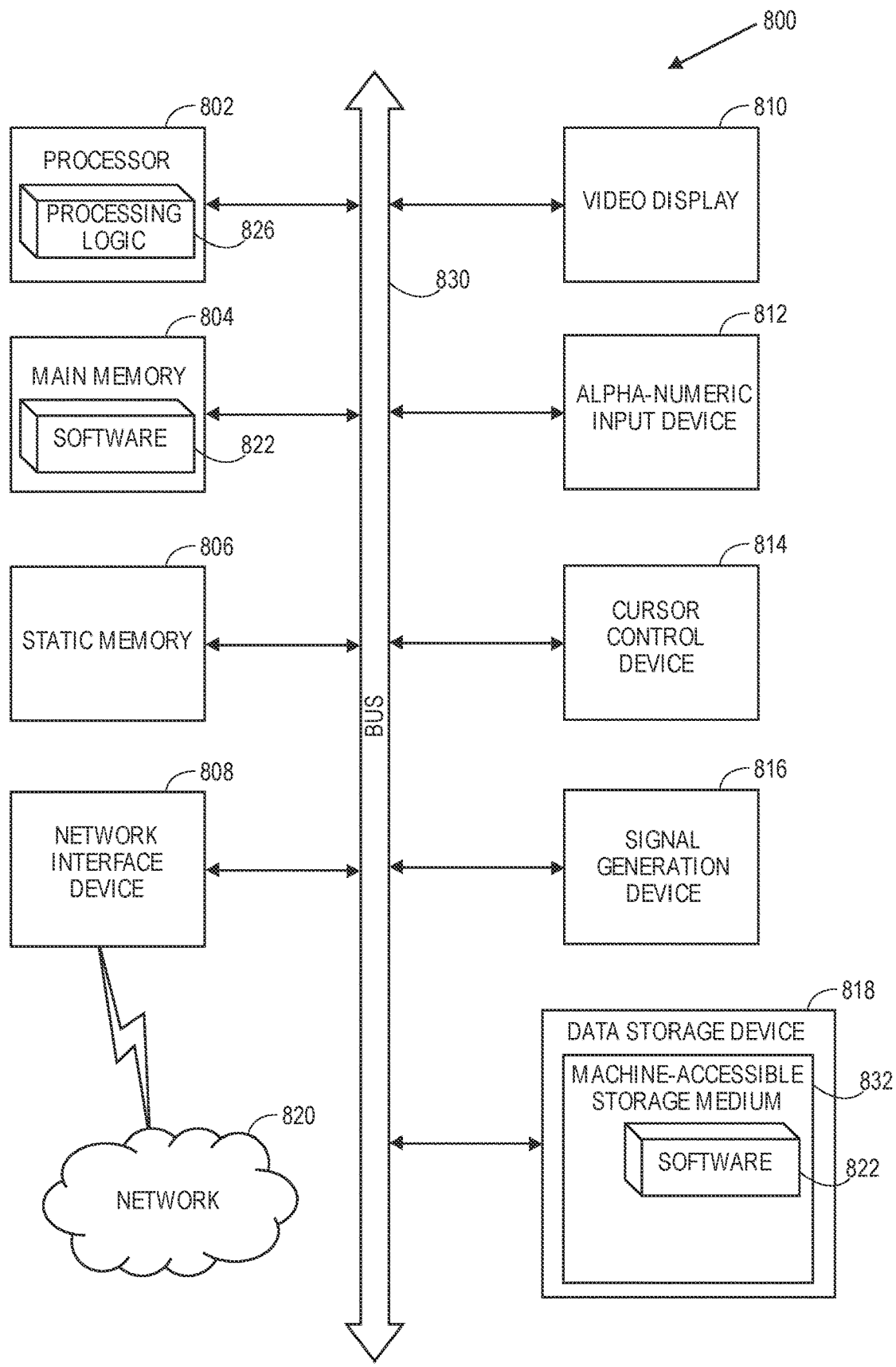
FIG. 8 illustrates a block diagram of an exemplary computer system, in accordance with an embodiment of the present disclosure.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), MRAM, etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of depositing a metal oxo photoresist on a substrate. The method includes vaporizing a metal precursor into a vacuum chamber and vaporizing an oxidant into the vacuum chamber. The metal precursor and the oxidant may be sequentially provided into the vacuum chamber or supplied to the vacuum chamber at the same time. The reaction between the metal precursor and the oxidant result in the formation of the metal oxo photoresist on the substrate. The metal oxo photoresist may be treated with a plasma treatment in some embodiments.

Thus, methods for forming a metal oxo photoresist using vapor phase processes have been disclosed.

What is claimed is:

1. A method of forming a photoresist layer over a substrate in a vacuum chamber, comprising:
providing a metal precursor vapor into the vacuum chamber, wherein the metal precursor has a generic formula $MR_xL_y$, wherein M is a metal, R is a leaving group comprising one or more of an aryl, a carbene, or a group comprising silicon, germanium, or tin as a donor atom, and L is a bidentate ligand comprising one N donor atom and one O donor atom with the donor atoms bonded to M, and x is between 0 and 6, and y is between 0 and 6; and
providing an oxidant vapor into the vacuum chamber, wherein a reaction between the metal precursor vapor and the oxidant vapor results in the formation of the photoresist layer on a surface of the substrate, wherein the photoresist layer is a metal oxo containing material.

2. The method of claim 1, further comprising:
striking a plasma in the vacuum chamber during one or both of providing a metal precursor vapor into the vacuum chamber and providing an oxidant vapor into the vacuum chamber.

3. The method of claim 1, further comprising:
treating the photoresist layer with a plasma.

4. A method of forming a photoresist layer over a substrate in a vacuum chamber, comprising:
initiating a deposition cycle, wherein the deposition cycle comprises:
providing a metal precursor vapor into the vacuum chamber, wherein the metal precursor has a generic formula $MR_xL_y$, wherein M is a metal, R is a leaving group comprising one or more of an aryl, a carbene, or a group comprising silicon, germanium, or tin as a donor atom, and L is a bidentate ligand comprising one N donor atom and one O donor atom with the donor atoms bonded to M, and x is between 0 and 6, and y is between 0 and 6, and wherein the metal precursor vapor absorbs to a surface over the substrate;

purging the vacuum chamber;

providing an oxidant vapor into the vacuum chamber, wherein a reaction between the metal precursor absorbed to the surface over the substrate and the oxidant vapor results in the formation of the photoresist layer over the surface of the substrate, wherein the photoresist layer is a metal oxo containing material; and purging the vacuum chamber.

5. The method of claim 4, further comprising:

repeating the deposition cycle a plurality of times.

6. The method of claim 4, further comprising:

striking a plasma in the vacuum chamber during the deposition cycle.

7. The method of claim 4, wherein the deposition cycle further comprises:

treating the photoresist layer with a plasma.

8. The method of claim 7, further comprising:

treating the photoresist layer with a plasma after repeating the deposition cycle the plurality of times.

\* \* \* \* \*